United States Patent
Silberbauer et al.

(10) Patent No.: US 9,072,191 B2
(45) Date of Patent: Jun. 30, 2015

(54) CONFIGURABLE RACK AND RELATED METHODS

(75) Inventors: Kristian Silberbauer, Ribe (DK); Carsten Nommensen Tingskov, Fredericia (DK); Jacob Damgaard Schmidt, Vejen (DK); Torben Müller, Vejle (DK); Casper Juel Winther, Fredericia (DK)

(73) Assignee: SCHNEIDER ELECTRIC IT CORPORATION, West Kingston, RI (US)

( * ) Notice: Subject to any disclaimer, the term of this patent is extended or adjusted under 35 U.S.C. 154(b) by 897 days.

(21) Appl. No.: 12/982,256

(22) Filed: Dec. 30, 2010

(65) Prior Publication Data

US 2012/0170175 A1   Jul. 5, 2012

(51) Int. Cl.
  *H05K 7/14*   (2006.01)
  *H02B 1/20*   (2006.01)
  *H02B 1/21*   (2006.01)

(52) U.S. Cl.
  CPC .............. *H05K 7/1457* (2013.01); *H02B 1/205* (2013.01); *H02B 1/21* (2013.01); *H05K 7/1432* (2013.01)

(58) Field of Classification Search
  CPC ... H02B 1/056; H02B 1/00; H02B 1/20–1/22; G06F 1/1616; G06F 1/1656; G06F 1/181; H05K 5/0026–5/0082; H05K 7/02; H05K 7/1457; H05K 7/1432; H01R 13/447; H01R 13/70; H01R 13/6658; H01R 25/006; H01L 2224/48091; H01L 2924/19041
  USPC .................................................. 361/600–678
  See application file for complete search history.

(56) References Cited

U.S. PATENT DOCUMENTS

| | | | | |
|---|---|---|---|---|
| 3,405,386 A * | 10/1968 | McKee | | 439/637 |
| 3,949,277 A * | 4/1976 | Yosset | | 361/679.4 |
| 4,121,276 A * | 10/1978 | Kovatch et al. | | 361/614 |
| 5,095,403 A * | 3/1992 | Pin et al. | | 361/641 |
| 5,207,613 A * | 5/1993 | Ferchau et al. | | 454/184 |
| 5,749,671 A * | 5/1998 | Chauquet | | 403/384 |
| 5,764,504 A | 6/1998 | Brand et al. | | |
| 5,896,473 A * | 4/1999 | Kaspari | | 385/24 |
| 5,949,641 A * | 9/1999 | Walker et al. | | 361/600 |
| 5,982,652 A | 11/1999 | Simonelli et al. | | |

(Continued)

FOREIGN PATENT DOCUMENTS

| | | |
|---|---|---|
| EP | 1 202 415 A1 | 5/2002 |
| EP | 1 835 794 A2 | 9/2007 |

(Continued)

OTHER PUBLICATIONS

International Search Report for PCT/US2011/063718 mailed Jun. 21, 2012.

*Primary Examiner* — Zachary M Pape
(74) *Attorney, Agent, or Firm* — Lando & Anastasi LLP

(57) ABSTRACT

A configurable rack for supporting components of an uninterruptible power supply includes a frame assembly having a front and a rear. At least one of the front and the rear is configured to receive electronic modules in stacked relation along a height of the frame assembly. The configurable rack further includes a busbar backplane disposed between the front and the rear. The busbar backplane extends vertically within the frame assembly and is configured to be electrically coupled to the at least one electronic module received within the front and/or the rear of the frame assembly.

16 Claims, 13 Drawing Sheets

(56) References Cited

U.S. PATENT DOCUMENTS

| | | | |
|---|---|---|---|
| 6,160,699 A * | 12/2000 | Gibson et al. | 361/643 |
| 6,205,029 B1 * | 3/2001 | Byrne et al. | 361/724 |
| 6,310,783 B1 | 10/2001 | Winch et al. | |
| 6,317,348 B1 | 11/2001 | Vackar | |
| 6,452,805 B1 * | 9/2002 | Franz et al. | 361/724 |
| 6,483,709 B1 | 11/2002 | Layton | |
| 6,501,768 B2 * | 12/2002 | Marin et al. | 370/465 |
| 6,545,850 B1 * | 4/2003 | Shearman et al. | 361/113 |
| 6,563,048 B2 | 5/2003 | Holt et al. | |
| 6,741,463 B1 | 5/2004 | Akhtar et al. | |
| 6,754,066 B2 | 6/2004 | Doan et al. | |
| 6,762,362 B1 * | 7/2004 | Cavanaugh et al. | 174/68.2 |
| 6,826,036 B2 * | 11/2004 | Pereira | 361/624 |
| 6,839,361 B2 * | 1/2005 | Marin et al. | 370/535 |
| 6,882,530 B2 * | 4/2005 | Cyphers et al. | 361/829 |
| 6,948,021 B2 * | 9/2005 | Derrico et al. | 710/302 |
| 6,967,283 B2 | 11/2005 | Rasmussen et al. | |
| 6,987,673 B1 * | 1/2006 | French et al. | 361/727 |
| 6,992,247 B2 | 1/2006 | Rasmussen et al. | |
| 7,076,592 B1 * | 7/2006 | Ykema | 710/305 |
| 7,154,761 B1 * | 12/2006 | Camerlo et al. | 361/788 |
| 7,187,547 B1 * | 3/2007 | French et al. | 361/679.33 |
| 7,239,528 B1 * | 7/2007 | McLeod | 361/796 |
| 7,289,334 B2 | 10/2007 | Behrens et al. | |
| 7,339,786 B2 * | 3/2008 | Bottom et al. | 361/679.41 |
| 7,358,439 B2 | 4/2008 | Rasmussen et al. | |
| 7,425,682 B2 | 9/2008 | Rasmussen et al. | |
| 7,675,740 B2 | 3/2010 | Rasmussen et al. | |
| 7,715,207 B2 | 5/2010 | Behrens et al. | |
| 7,718,889 B2 | 5/2010 | Rasmussen et al. | |
| 7,760,516 B2 | 7/2010 | Johnson, Jr. et al. | |
| 7,761,622 B2 | 7/2010 | Nguyen | |
| 7,791,863 B2 * | 9/2010 | Strackbein et al. | 361/622 |
| 7,821,792 B2 * | 10/2010 | Belady et al. | 361/735 |
| 7,929,310 B2 * | 4/2011 | Belady et al. | 361/735 |
| 8,174,821 B2 * | 5/2012 | Fontana et al. | 361/601 |
| 8,451,606 B2 * | 5/2013 | Hirano et al. | 361/695 |
| 8,456,857 B2 * | 6/2013 | Groschner et al. | 361/784 |
| 8,472,167 B2 * | 6/2013 | Walance et al. | 361/601 |
| 2002/0084089 A1 | 7/2002 | Holt et al. | |
| 2002/0134567 A1 | 9/2002 | Rasmussen et al. | |
| 2002/0168065 A1 * | 11/2002 | Sajadi et al. | 379/428.01 |
| 2003/0011969 A1 | 1/2003 | Doan et al. | |
| 2003/0112582 A1 * | 6/2003 | Sanders et al. | 361/600 |
| 2003/0121689 A1 | 7/2003 | Rasmussen et al. | |
| 2003/0223193 A1 * | 12/2003 | Smith et al. | 361/687 |
| 2004/0057216 A1 * | 3/2004 | Smith et al. | 361/724 |
| 2004/0168818 A1 * | 9/2004 | Layden et al. | 174/50 |
| 2004/0231875 A1 | 11/2004 | Rasmussen et al. | |
| 2005/0050272 A1 | 3/2005 | Behrens et al. | |
| 2005/0185363 A1 | 8/2005 | Rasmussen et al. | |
| 2005/0265004 A1 * | 12/2005 | Coglitore et al. | 361/724 |
| 2005/0270751 A1 * | 12/2005 | Coglitore et al. | 361/724 |
| 2005/0286235 A1 * | 12/2005 | Randall et al. | 361/724 |
| 2006/0044766 A1 * | 3/2006 | Hartel et al. | 361/724 |
| 2006/0126278 A1 * | 6/2006 | McLeod | 361/624 |
| 2006/0151190 A1 | 7/2006 | Rasmussen et al. | |
| 2006/0203460 A1 * | 9/2006 | Aviv | 361/788 |
| 2007/0097659 A1 | 5/2007 | Behrens et al. | |
| 2007/0109731 A1 * | 5/2007 | Bergmann et al. | 361/624 |
| 2007/0109733 A1 * | 5/2007 | Malkowski et al. | 361/648 |
| 2007/0109736 A1 * | 5/2007 | Coglitore | 361/683 |
| 2007/0223160 A1 * | 9/2007 | Coffey et al. | 361/62 |
| 2007/0291430 A1 | 12/2007 | Spitaels et al. | |
| 2008/0030947 A1 | 2/2008 | Behrens et al. | |
| 2008/0080146 A1 * | 4/2008 | King et al. | 361/724 |
| 2008/0101049 A1 * | 5/2008 | Casto et al. | 361/788 |
| 2008/0137266 A1 * | 6/2008 | Jensen et al. | 361/602 |
| 2009/0034166 A1 | 2/2009 | Rasmussen et al. | |
| 2009/0034167 A1 | 2/2009 | Rasmussen et al. | |
| 2009/0086441 A1 * | 4/2009 | Randall et al. | 361/724 |
| 2010/0172077 A1 * | 7/2010 | Randall et al. | 361/679.4 |
| 2010/0314166 A1 * | 12/2010 | Malkowski et al. | 174/72 B |
| 2011/0149526 A1 * | 6/2011 | Turner | 361/730 |
| 2012/0069494 A1 * | 3/2012 | Knight et al. | 361/630 |

FOREIGN PATENT DOCUMENTS

| | | |
|---|---|---|
| WO | 2009/088755 A1 | 7/2009 |
| WO | 2010/097787 A1 | 9/2010 |

* cited by examiner

CONFIGURABLE RACK AND RELATED METHODS

BACKGROUND OF THE INVENTION

1. Field of Disclosure

Embodiments of the disclosure relate generally to methods and apparatus for providing uninterruptible power to sensitive and/or critical loads. More specifically, embodiments of the disclosure relate to racks used to house components of uninterruptible power supplies.

2. Discussion of Related Art

Centralized data centers for computer, communications and other electronic equipment have been in use for a number of years, and more recently, with the increasing use of the Internet, large scale data centers that provide hosting services for Internet Service Providers (ISPs), Application Service Providers (ASPS) and Internet content providers are become increasingly popular. It is often desirable to operate equipment within data centers seven days a week, 24 hours per day, with little or no disruption in service. To prevent any disruption in service, it is common practice in data centers to use uninterruptible power supplies (UPSs) to ensure that the equipment within the data centers receives continuous power throughout any black out or brown out periods. Typically, data centers are equipped with a relatively large UPS at the main power distribution panel for the facility. Often, the UPS is selected to have sufficient capacity to meet the power requirements for all of the equipment within the facility.

For example, equipment within data facilities in the United States may have 120 volt or 208 volt input power requirements, and a power distribution unit having a step down transformer is often used between the output of the UPS and power feeds for equipment racks to lower a 480 volt input voltage to 120 volts or 208 volts for the equipment racks. A circuit breaker panel is typically either installed in the PDU or mounted near the PDU. In countries outside the United States, equipment racks may be configured for equipment having different or varying power requirements.

There are several drawbacks with the traditional design of data centers. One drawback in the design of traditional data centers involves the difficulty in selecting the size of a UPS for the facility. As briefly discussed above, many newer data centers are used as web hosting facilities that essentially lease space and utilities to Internet content providers or Internet Service Providers. Often when these data centers are initially designed, the final power requirements for the facility are not known, and it is often not for some time, if ever, that a facility becomes fully occupied. If the UPS is selected for full capacity, and the facility is operated at substantially below full capacity for some time, then the overhead costs of the facility may become undesirably high due to the cost of the UPS. Further, there are power losses associated with a UPS. If a UPS is operated at substantially below full capacity, then these losses may become significant when compared with the total power consumption of the facility. If a UPS for a facility is selected for less than full capacity, then it may have to be replaced, at considerable cost, when the usage of the facility increases.

Today's three-phase UPS systems are typically based on a highly integrated rack-based frame. The rack may consist of firmly installed hardware and removable modules. Batteries are sometimes mounted in separate dedicated frames, and for smaller systems, the batteries may be mounted in the same frame, but in fixed battery positions. The typical approach, while providing a very robust and complete UPS system for a given power range, requires that the customer of the UPS system pay a premium price for a full system, even if the requirements placed on the UPS system are below the maximum capacity of the system.

BRIEF SUMMARY OF THE INVENTION

One aspect of the disclosure is directed to a configurable rack for supporting components of an uninterruptible power supply. In one embodiment, the configurable rack comprises a frame assembly having a front and a rear. At least one of the front and the rear is configured to receive electronic modules in stacked relation along a height of the frame assembly. The configurable rack further comprises a busbar backplane disposed between the front and the rear. The busbar backplane extends vertically within the frame assembly and is configured to be electrically coupled to the at least one electronic module received within the front and/or the rear of the frame assembly.

Embodiments of the configurable rack further include extending the busbar backplane along a plane parallel to a plane defined by at least one of the front and the rear. The busbar backplane includes a plurality of busbars, each busbar extending in a plane perpendicular to the plane of the at least one of the front and the rear. Each busbar includes contact areas configured to connect to the at least one electronic module. The configurable rack further comprises a connector coupled to the at least one electronic module. In a certain embodiment, the connector includes a pair of spring-loaded arms configured to resiliently engage the busbar. The configurable rack further comprises at least one redundant connector, in which at least one redundant connector is positioned along a side of the frame assembly. The front and the rear are configured so that electronic modules are positioned vertically within the frame assembly at predetermined intervals. In certain embodiments, the electronic module includes a power module and/or a battery.

Another aspect of the disclosure is directed to a method of providing uninterruptible power to sensitive and/or critical loads. In one embodiment, the method comprises: providing selected components of an uninterruptible power supply comprising a frame assembly configured to receive electronic modules in stacked relation; inserting at least one electronic module into the frame assembly; and electrically coupling the at least one electronic module to a busbar backplane disposed within the frame assembly, the busbar backplane extending vertically within the frame assembly and configured to provide power to the at least one electronic module received within the frame assembly.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION OF THE INVENTION

Figure 1:
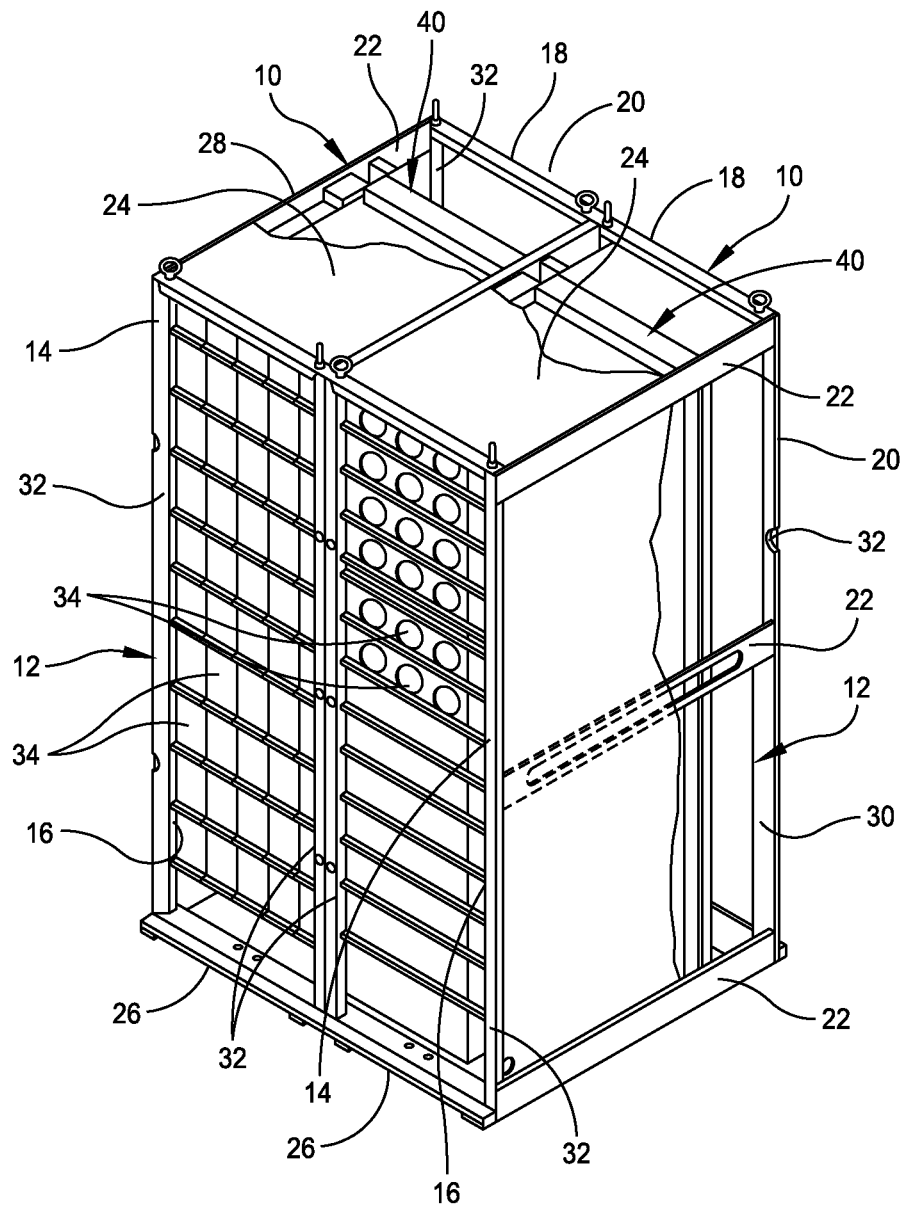
FIG. 1 is a perspective view of two UPS racks configured to support electrical equipment and modules.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Uninterruptible power supplies are used to provide conditioned and continuous power to equipment provided within data centers, especially throughout any black out or brown out periods. As mentioned above, data centers are equipped with relatively large UPSs at the main power distribution panel for the facility. In certain embodiments, a configurable rack in the form of an uninterruptible power supply includes a frame assembly having a front frame defining a front of the configurable rack, a rear frame defining a rear of the configurable rack, and side frame members that connect the front frame to the rear frame. The frame assembly is a box-shaped structure having, in addition to the front and back, two sides, a top and a bottom. The front frame and the rear frame are each configured to receive electronic modules in stacked relation along a height of the frame. In certain embodiments, the modules may be rack-mounted or mounted on rails or slides within the interior of the frame assembly. The configurable rack may include power modules and batteries to form an uninterruptible power supply, and other pieces of equipment required to operate the uninterruptible power supply. These modules are rack-mounted in the well-known manner.

In one embodiment, a busbar backplane is disposed between the front frame and the rear frame, with the busbar backplane extending vertically within the frame assembly. In a certain embodiment, the busbar backplane is positioned adjacent the rear frame. In other embodiments, the busbar backplane may be positioned anywhere within the interior of the frame assembly, such as the midpoint of the distance between the front frame and the rear frame. The busbar backplane is electrically coupled to the electronic modules placed within the UPS rack. In a certain embodiment, the busbar backplane extends along a plane parallel to planes defined by the front frame and the rear frame. The busbar backplane includes a plurality of busbars that embody vertical connectors, each extending in a plane perpendicular to the planes of the front frame and the rear frame. Horizontal frame members connect the busbars so that they are spaced a predetermined distance from one another. Each busbar includes several contact areas configured to connect to the electronic module, both from the front of the busbar and the rear of the busbar. The electronic modules include a connector, which may be configured to include a pair of spring-loaded arms to resiliently engage the busbar. The frame assembly may also be configured with a redundant connector, which is positioned along a side of the frame assembly.

Figure 2:
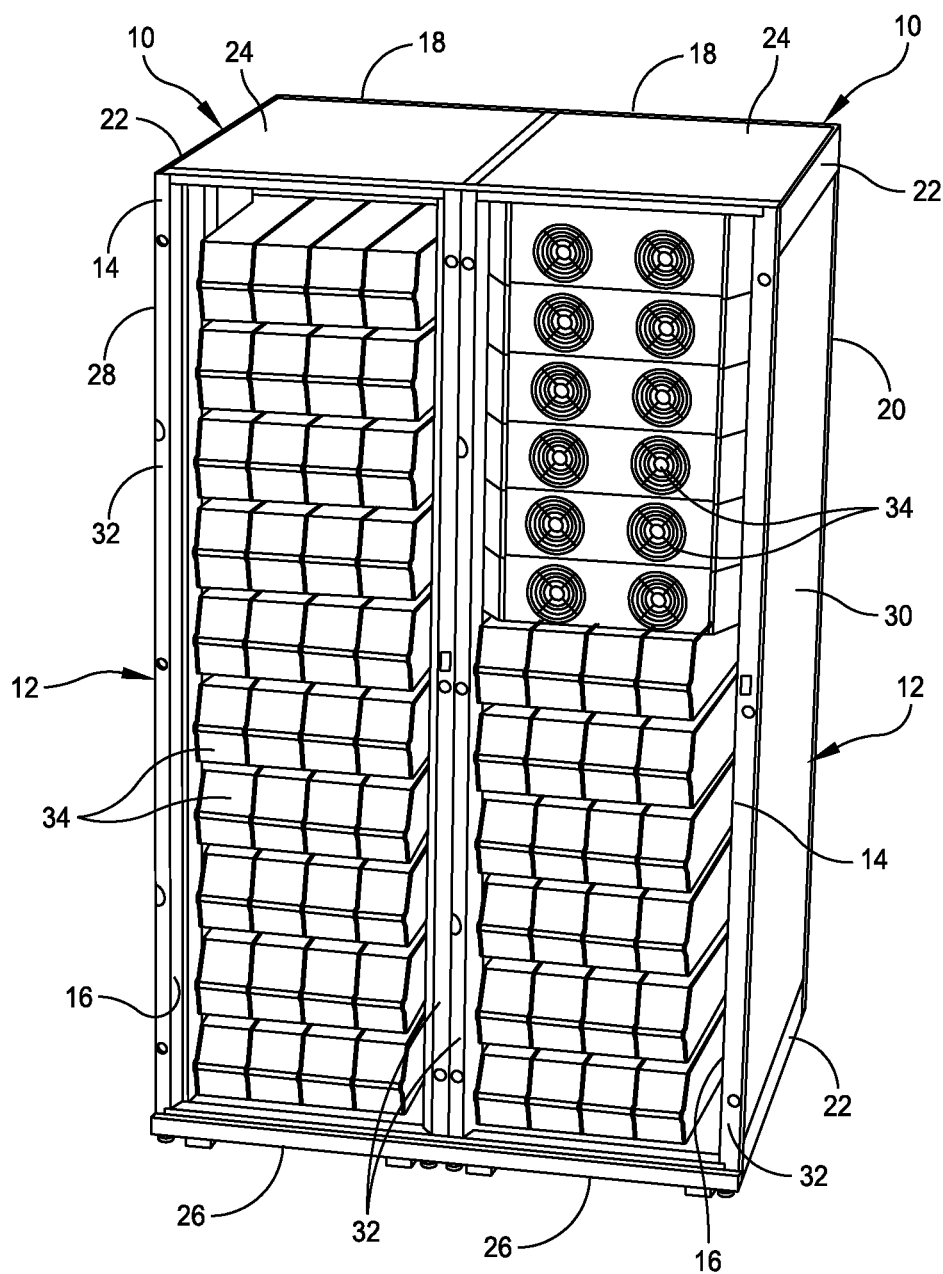
FIG. 2 is a front perspective view of the two UPS racks illustrated in FIG. 1.

Referring to the drawings, and more particularly to FIGS. 1 and 2, two configurable racks, each generally indicated at 10, which are each referred to herein as a "UPS rack" since a common embodiment of the configurable rack includes components used to create an uninterruptible power supply, are configured in accordance with at least one embodiment of the present disclosure to house UPS components, such as power modules, static switches, batteries, input/output (I/O) modules, maintenance bypass panels, mains connections, DC breakers, and the like. In one embodiment of the present disclosure, each UPS rack 10 may be provided in the form of a kit, which can be easily assembled with the use of simple tools, e.g., a screwdriver, if any, and without difficult manipulation. When assembled, the UPS rack 10 is a rectangular, box-like structure that is configured such that it can be assembled with or connected to other, similarly-shaped structures.

The UPS rack 10 includes a frame assembly, generally indicated at 12, having a front frame 14, which defines a front 16 of the UPS rack, and a rear frame 18, which defines a rear 20 of the UPS rack. The frame assembly 12 further includes several side frame members, each indicated at 22, which connect the front frame 14 to the rear frame 18. Although six side frame members 22 are illustrated in FIGS. 1-4, it should be understood that fewer or more than six side frame members can be provided to assemble the front and rear frames 14, 18. For example, for shorter UPS racks, four side frame members are used to attach the front and rear frames. As shown, two of the six side frame members 22 are provided to attach the front and rear frames 14, 18 at the top of the front and rear frames. Similarly, two side frame members 22 attach the front and rear frames 14, 18 at the bottom of the front and rear frames. And, two side frame members 22 are positioned approximately halfway along the height of the UPS rack 10 to further connect the front and rear frames 14, 18. As a result, the frame assembly 12 of the UPS rack 10, in addition to defining the front 16 and the rear 20 of the UPS rack, defines a top 24, a bottom 26, a left side 28 and a right side 30. As will be disclosed in greater detail below, the UPS rack 10 is configurable to accommodate equipment having a variety of shapes and sizes. In addition, as alluded to above, the UPS rack 10 can be conveniently broken down and disassembled for transport or storage. In at least one embodiment, the equipment UPS rack 10 may be configured to be the same size and shape as a nineteen-inch rack.

In FIGS. 1 and 2, there are two UPS racks 10 arranged in side-by-side relation. The components of the frame assembly 12 are fabricated from any suitable lightweight, rigid material, such as, but not limited to, steel or aluminum. It should be noted that the chosen material, in addition to being lightweight and rigid in construction, should be reasonable in cost and easy to fabricate. In at least one embodiment of the present disclosure, it is desirable to use materials having a conductive finish to allow grounding of the electronic components housed within the UPS rack 10 and to allow all conductive portions of the UPS rack 10 to be grounded.

Each UPS rack 10 has a universal interface for receiving all types of standardized modules, which are rack-mounted at the front and at the rear of the UPS rack. In the shown embodiment, the front 16 of the UPS rack 10 is configured to be deeper to receive larger modules within the UPS rack. In this embodiment, the rear 20 of the UPS rack 10 is configured to be shallower depth-wise than the front 16 of the UPS rack to receive smaller modules within the UPS rack. The front frame 14 and the rear frame 18 include vertical rails, each indicated at 32. The UPS rack 10 illustrated throughout the drawings is a "four post" UPS rack, having four vertical rails or posts 32 placed at the four corners of the UPS rack.

With UPS racks, such as UPS rack 10, there are a variety of well-known methods of securing the rack-mounted modules, such as modules 34, within the UPS rack. One method of securing the modules 34 within the UPS rack 10 is to configure each vertical rail 32 with a plurality of mount openings, which are tapped to receive a particular type of threaded bolt. The modules 34 to be mounted within the frame assembly 12 of the UPS rack 10 are configured with mating connectors to secure the modules to the frame assembly. This method of securing the modules 34 within the UPS rack 10 may not be practical for situations in which the modules require frequent replacement, due to the possibility of the threads becoming damaged or one or more threaded bolts binding and breaking off, thus rendering the mount opening unusable. Tapped-hole mounting systems may be used in situations in which the modules will not be replaced.

Another method of securing the modules 34 within the UPS rack 10 is to configure the vertical rails 32 with clearance openings, which are large enough to permit a bolt to be freely inserted through the openings without binding. In a particular embodiment, the bolt is fastened in place using fastener, such as a cage nut having a captive nut and a spring steel cage designed to hold the nut and clip onto the vertical rail within the mount opening. In the event of a nut being stripped out or a bolt breaking, the nut can be easily removed and replaced with a new one. Production of clearance-hole rack mounting systems may be less expensive because tapping the openings is eliminated and cage nuts are reduced or even replaced with fewer, less expensive fasteners.

Yet another method of securing the modules 34 within the UPS rack 10 is to configure the vertical rails 32 with square mount openings, which enable boltless mounting. With this method, the rack-mount system includes mounting clips that are inserted through and hook down into lips formed by the square openings. Installation and removal of hardware in a square opening mounting system is very easy and boltless, where the weight of the modules 34 and small retention clips are all that is necessary to hold the modules in place.

As described above, the rack-mountable modules 34 may be mounted by bolting or clipping the front panels of the modules to the vertical rails 32 of the UPS rack 10. One weakness of these types of mounting systems is that all the structural support is at one edge of the module, so heavier modules and equipment can be designed to use a second pair of vertical mounting rails (not shown) located at the back of the modules and equipment. To increase strength, the second pair of vertical rails can be fabricated from a wider folded strip. The vertical rails may be fabricated from steel of around 2 mm thickness (the official standard recommends a minimum of 1.9 mm), or of slightly thicker aluminum. The vertical rails or posts described herein would constitute components of the front frame 14 and the rear frame 18 of the frame assembly 12.

Heavy modules 34, such as power modules 34A or batteries 34B (FIG. 3), which may require access for service or replacement, can be mounted on rails or slides and not directly to the vertical rails 32 as described above. In certain embodiments, for each module 34, a pair of sliding rails (not shown) is mounted directly onto the frame assembly 12 of the UPS rack 10, and the module then slides into the interior of the UPS rack along the rails, which support it. When in place, the module 34 may also then be bolted to the frame assembly 12 of the UPS rack 10. The sliding rails may also be able to fully support the module in a position where it has been slid clear of the frame assembly 12 of the UPS rack 10. This configuration enables inspection or maintenance of modules, which will then be slid back into the frame assembly 12 of the UPS rack 10. The sliding rails can lock in various extended positions to prevent the module from moving when extended out from the rack for service. The modules may be configured with one or more locking pins (not shown) on the sides of the modules that drop into slots on the extended rail assembly. This facilitates and eases module installation and removal since there is no need for the module to be held in midair while an installer fastens each rail to the sides of the module with screws or tool-less hardware.

Since the mount openings provided in the vertical rails 32 are vertically symmetrical, it may be possible to mount rack-mountable modules and equipment upside-down. However, not all modules and equipment are suitable for this type of mounting. Each UPS rack 10 illustrated in FIGS. 1 and 2 is capable of supporting modules at the front 16 and the rear 20 of the UPS rack. The rear frame 18 of the UPS rack may be similarly configured as the front frame 14 to support smaller pieces of equipment, which may include I/O modules, maintenance bypass panels, mains connections, and DC breakers. The manner in which the electric components and modules are mounted within the UPS rack 10 are well-known in the art.

Figure 3:
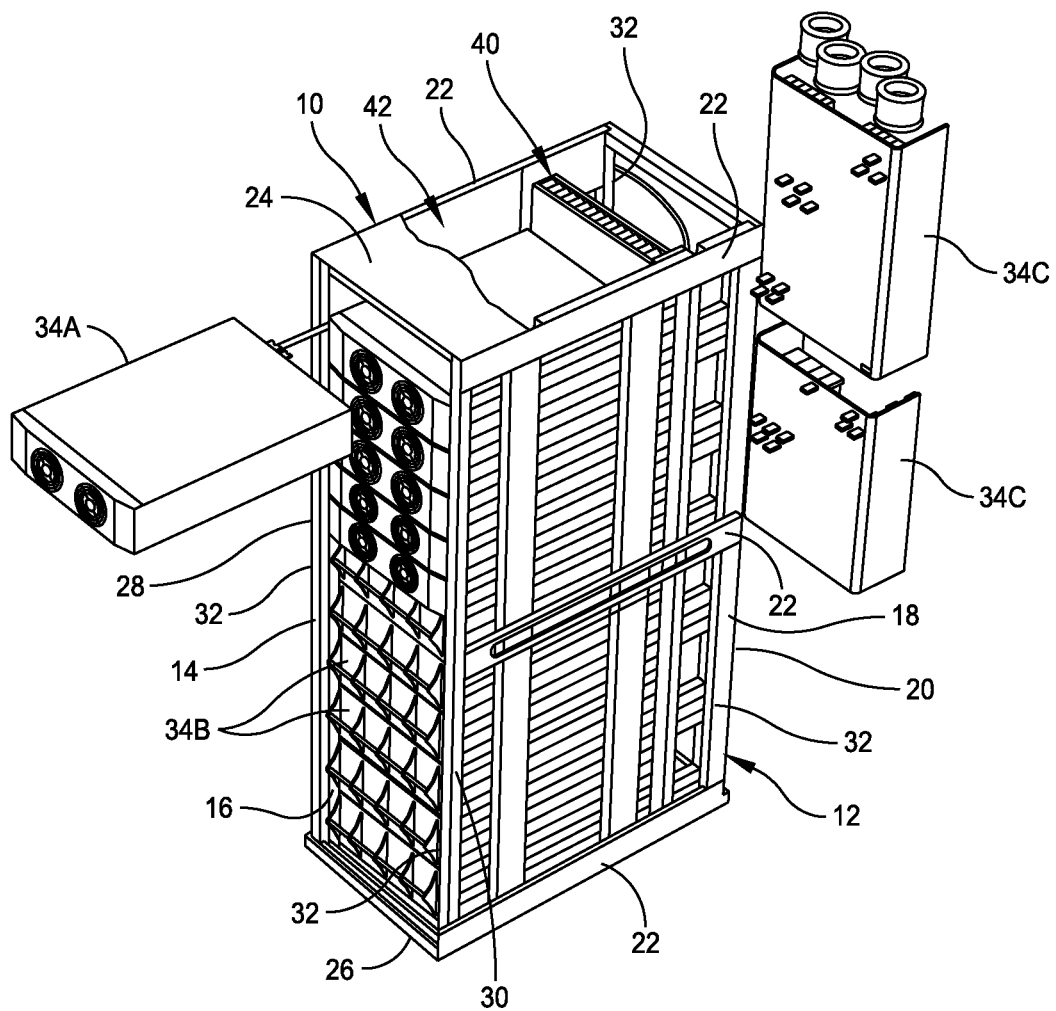
FIG. 3 is a perspective view of a single UPS rack showing modules of the UPS rack in a pre-installed position.

Referring to FIG. 3, a single UPS rack 10 is illustrated with several modules 34 shown in the process of being installed or removed from the UPS rack. As shown, several power modules 34A are rack-mounted in the front 16 of the UPS rack 10. The power modules 34A are positioned in stacked relation (i.e., one over the other) near the top 24 of the UPS rack 10. Several batteries 34B are rack-mounted in the front 16 of the UPS rack 10 in stacked relation below the power modules 34A. A single power module 34A is shown in a position in which it is being inserted into or removed from the UPS rack 10. The power module 34A, in one embodiment, may be supported by within the interior of the UPS rack by slide rails (not shown) in the manner described above. The rear 20 of the UPS rack 10 is configured to receive one or more of the following modules 34—I/O module, maintenance bypass panel, mains connection, battery breaker, and rack interface. These modules 34 are slide-mounted as well. As shown, two maintenance bypass panels 34C are shown in a position in which they are being inserted into or removed from the UPS rack 10.

The UPS rack 10 of embodiments disclosed herein further includes a busbar backplane, generally indicated at 40, which is disposed between the front frame 14 and the rear frame 18. As illustrated in FIGS. 1-3, the busbar backplane 40 is positioned toward the rear 20 of the UPS rack 10 within the interior of the UPS rack. In the shown example, the busbar backplane 40 is positioned beyond the midpoint of the depth of the UPS rack 10, approximately three quarters of the distance between the front frame 14 and the rear frame 18 toward the rear frame. It should be understood that the busbar backplane 40 may be positioned anywhere within the interior of the UPS rack 10 and still fall within the scope of the present disclosure. For example, the busbar backplane 40 may be positioned at the midpoint of the distance between the front frame 14 and the rear frame 18, or toward the front frame. As will be discussed in greater detail below, the busbar backplane 40 is provided to electrically connect the components mounted within the UPS rack 10.

Figure 4:
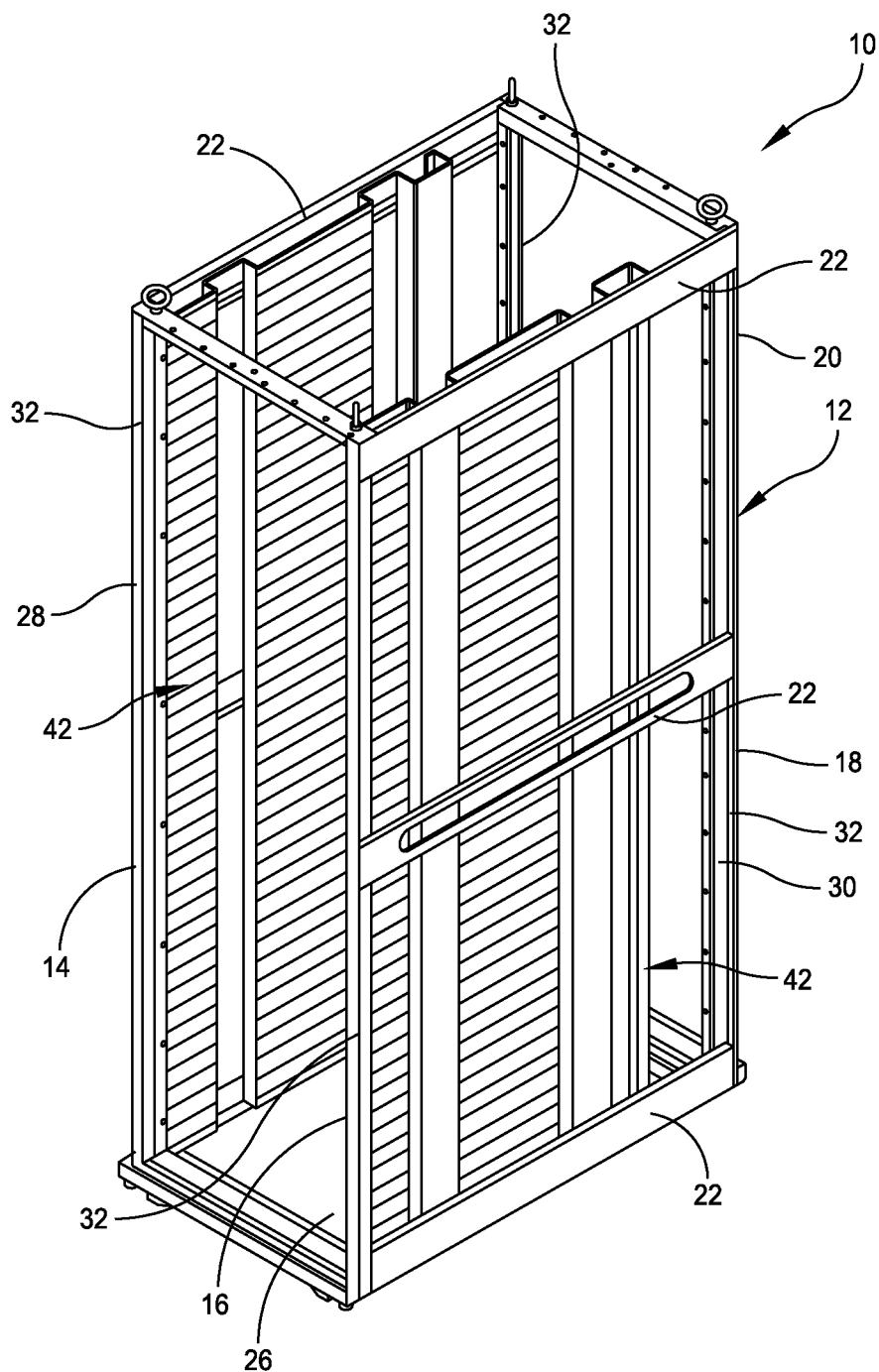
FIG. 4 is a perspective view of the single UPS rack illustrated in FIG. 4 with modules and a busbar backplane removed from a frame assembly of the UPS rack.
Figure 5:
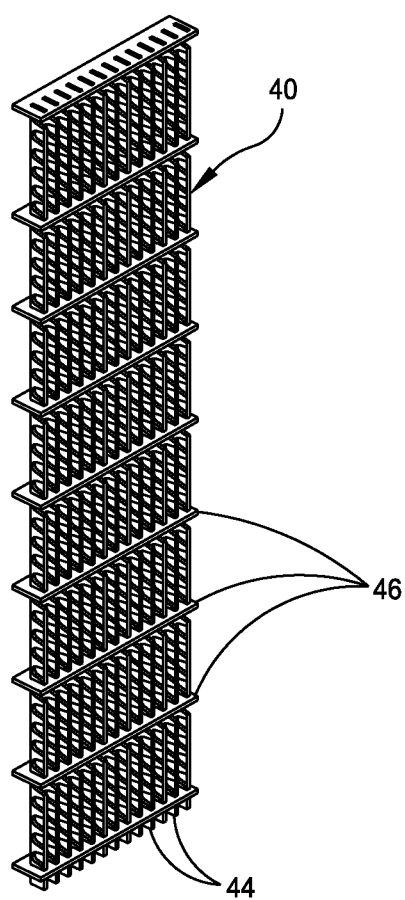
FIG. 5 is a perspective view of the busbar backplane.

Referring to FIGS. 4 and 5, FIG. 4 illustrates the frame assembly 12 of the UPS rack 10 having a redundant connector, generally indicated at 42, which will be described in detail below. FIG. 5 illustrates the busbar backplane 40 isolated from the frame assembly 12. In certain embodiments, the busbar backplane 40 is configured so that connection may be made to any type of device or module. The busbar backplane 40 may be dimensioned and configured to achieve or otherwise accommodate a specific power range, but is of sufficient complexity to handle wide ranges. The busbar backplane 40 is also configured to connect any of the busbars included at any U-position along a height of the UPS rack 10, both in the front 16 of the UPS rack and in the rear 20 of the UPS rack. In certain embodiments, the busbar backplane 40 includes a plurality of busbars, each indicated at 40, which may be assembled from only two different stock-keeping unit ("SKU") numbers—one busbar that is fabricated from straight copper with no rework and another busbar that can be reversed for top or bottom mounting and for front and rear mounting.

In electrical power and distribution units, a busbar, such as busbar 44, may be a thick strip of copper or aluminum that conducts electricity within the UPS rack 10. Busbars are used to carry very large currents, or to distribute current to multiple devices within the unit. The size of the busbar 44 determines the maximum amount of current that can be safely carried. In certain applications, busbars 44 can have a cross-sectional area of as little as 10 mm$^2$ and as large as 50 mm in diameter (1,963 mm$^2$) or more. The shape of the busbars 44 can also be selected based on predetermined criteria. For example, in certain embodiments, busbars 44 can be either flat strips or hollow tubes as these shapes allow heat to dissipate more efficiently due to their high surface area to cross-sectional area ratio. Busbars 44 may either be supported on insulators, or insulation may completely surround the busbars. Neutral busbars 44 may be insulated as well. Ground busbars 44 can be bolted directly onto any metal chassis of the frame assembly 12. In some embodiments, busbars 44 can be enclosed in a metal housing, in the form of bus duct or busway, which may be referred to as a segregated-phase bus or an isolated-phase bus. Busbars 44 may be connected to each other and to electrical apparatus by bolted or clamp connections, such as the connectors discussed in greater detail below. In certain instances, joints between high-current bus sections have matching surfaces that are silver-plated to reduce the contact resistance.

Figure 6:
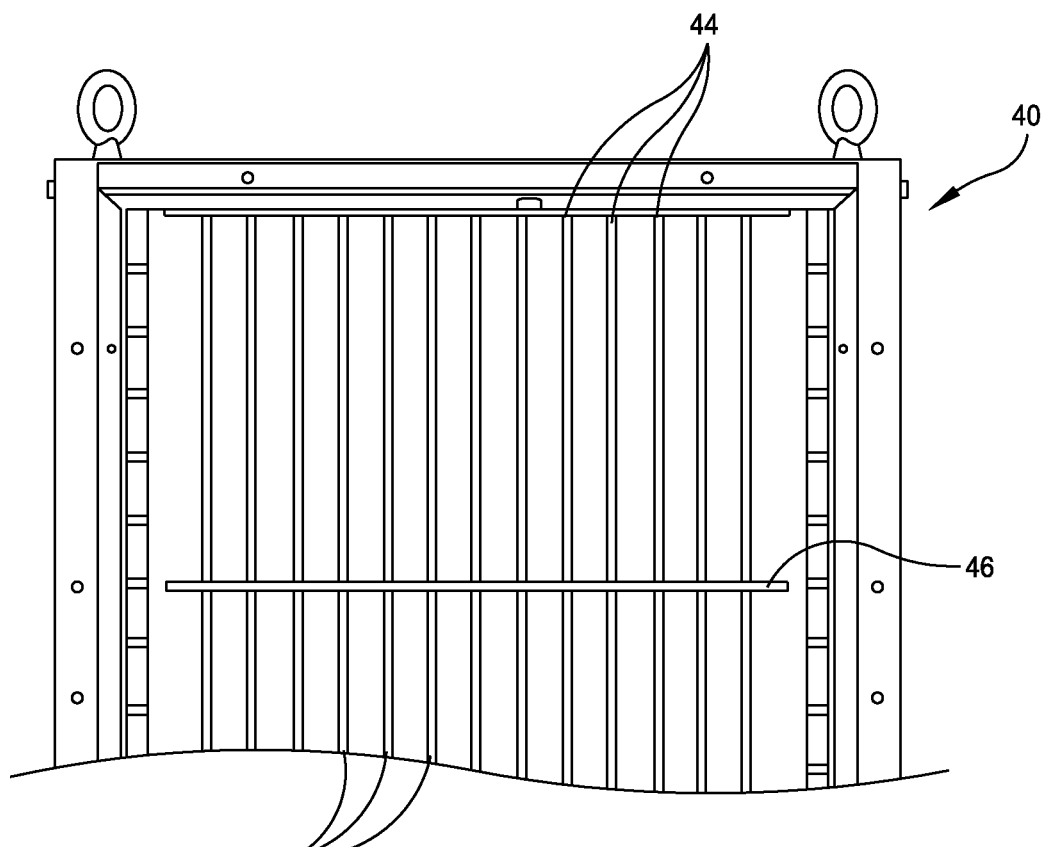
FIG. 6 is an enlarged view of a top portion of the busbar backplane.

As shown throughout the drawings, and in particular FIGS. 1-3, the busbar backplane 40 extends along a plane parallel to planes defined by the front frame 14 and the rear frame 18. As constructed, the busbars 44 of the busbar backplane 40 each extend in a plane perpendicular to the plane of the busbar backplane (and the planes of the front frame 14 and the rear frame 18). As shown in FIGS. 5 and 6, the busbars 44 are spaced from one another a predetermined distance. This distance may vary from one busbar 44 to the next. The distance between the busbars 44 should be sufficient to enable safe operation of the busbar backplane 40. Horizontal frame members, each indicated at 46, are provided to connect the busbars 44 so that they maintain their predetermined distance from one another and to provide structural stability to the busbar backplane 40. As shown in FIG. 5, there are several (e.g., nine) horizontal frame members 46 suitably connected to the busbars 44 along the length of the busbars. In the shown embodiment, the horizontal frame members 46 are spaced equidistant from one another.

FIG. 6 illustrates a top portion of the busbar backplane 40. In one embodiment, the busbars 44 may be oriented so that some of the busbars are connected to a mains connector (input power), some of the busbars are connected to power modules (output power), and some of the busbars are ground or neutral. The configuration of the busbar backplane 40 provides a universal busbar interface capable of supplying power to and from the modules 34 mounted within the UPS rack 10. The interface is accessible from the front 16 of the UPS rack 10 and from the rear 20 of the UPS rack. With the busbar backplane 40, it is possible to scale other functions than usual, such as scalability and redundancy of a static switch, for example. Unlike prior rack configurations, the busbar backplane 40 is configured to accommodate any number of module configurations. The arrangement is such that it is possible to position any type of module 34 in a U position along the height of the UPS rack 10 and connect any power connection from any U position along the height, from the front 16 and from the rear 20 of the UPS rack.

Figure 7:
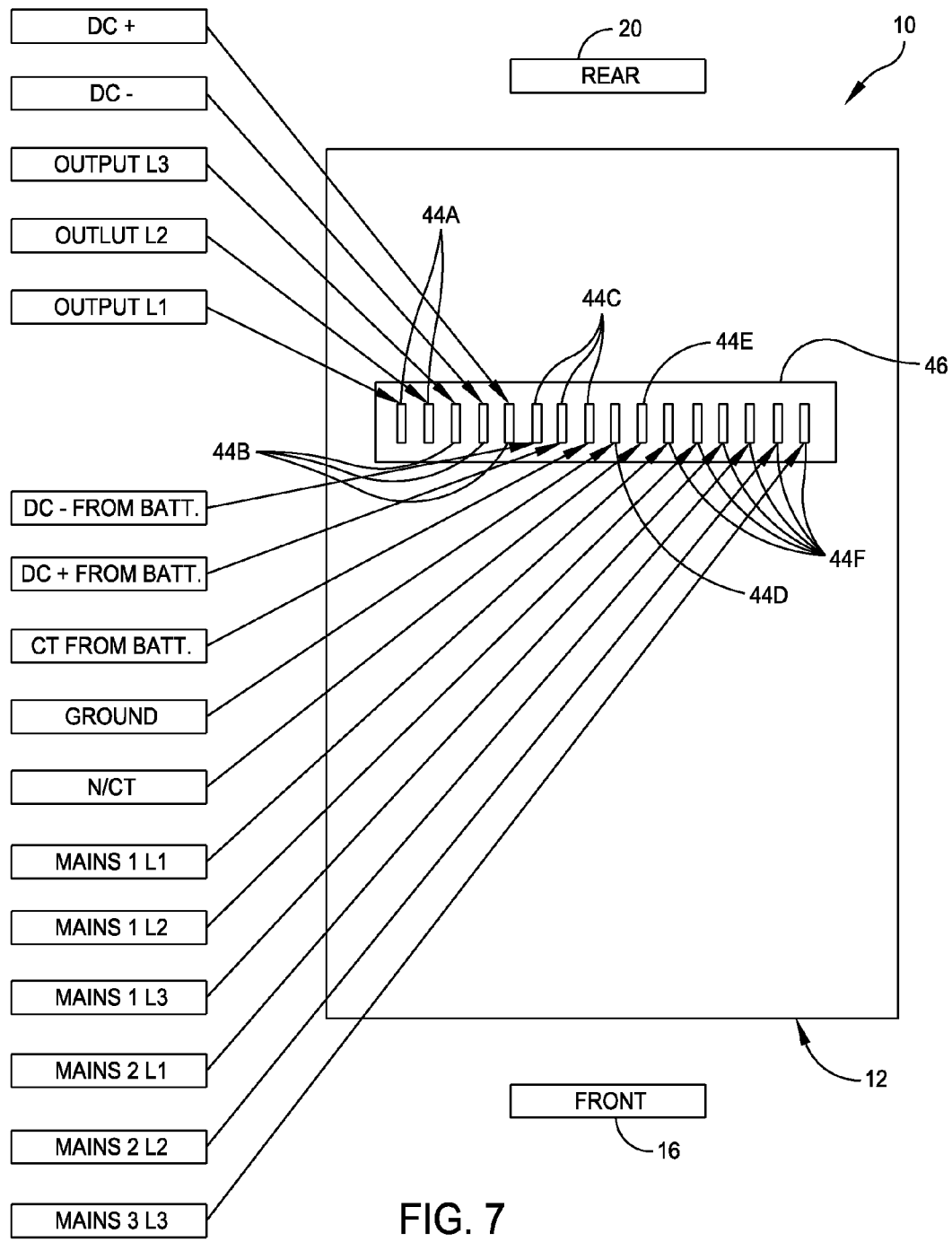
FIG. 7 is a schematic top view of the busbar backplane.

FIG. 7 illustrates an exemplary busbar backplane 40 configuration. As shown, from left to right in FIG. 7, two DC busbars 44A are provided at the far left-hand side of the busbar backplane 40. Next, moving to the right, three output busbars 44B are provided. The output busbars 44B are configured to be connected to power modules 34A, for example. Next, two DC busbars and one CT busbar 44C are provided. The busbars 44C are configured to be connected to battery modules 34B, for example. Next, ground and neutral busbars 44D, 44E are further provided. And finally, six mains busbars 44F are provided to be connected to two three-phase connections. The busbars 44 are placed in a way that enables access to and from each module 34 placed within the UPS rack 10, whether from the front 16 of the UPS rack or from the rear 20 of the UPS rack.

Figure 8:
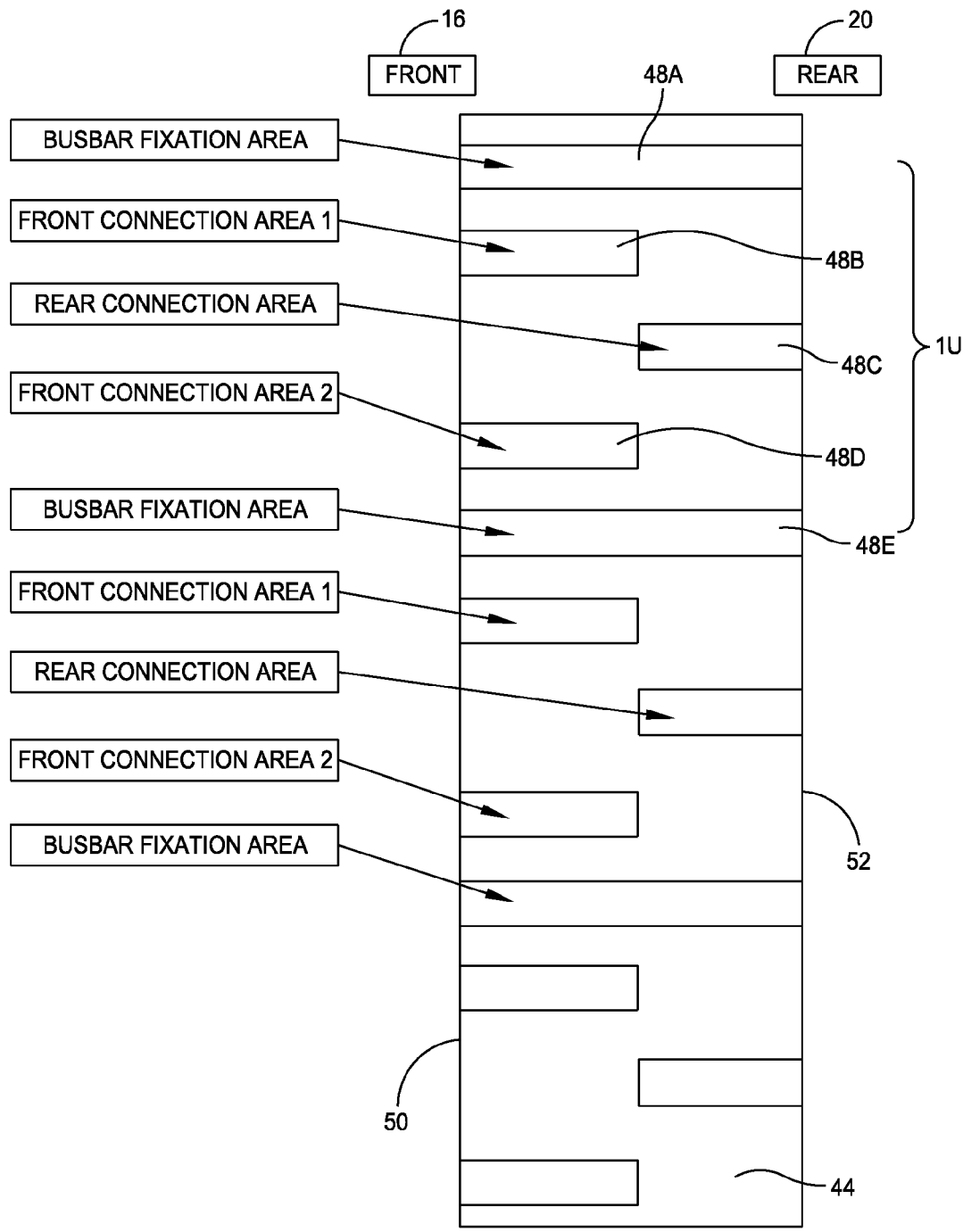
FIG. 8 is a schematic side view of a portion of the busbar backplane.

FIG. 8 illustrates contact areas, each indicated at 48, of a single busbar 44 or vertical connector. The orientation of contact areas 48 shown in the drawing figures are one example of where the contact areas can be positioned along a length of a busbar while maintaining a 1U spacing within the UPS rack 10. As shown, from top to bottom of the busbar 44, there are provided a fixation area 48A, a first front contact area 48B, a rear contact area 48C, a second front contact area 48D, and a busbar fixation area 48E. For each busbar 44, the two fixation areas 48A, 48E extend from a front edge 50 of the busbar to a rear edge 52 of the busbar. The first and second front contact areas 48B, 48D extend from the front edge 50 of the busbar 44 to a midpoint of the width of the busbar. The rear contact area 48C extends from the rear edge 52 of the busbar 44 to the midpoint of the width of the busbar. The space defined by these areas from the top fixation area 48A to the bottom fixation area 48E is 1U in height, i.e., 1.75 inches or 44.5 mm. This pattern repeats itself below the above-mentioned areas. Based on the desired configuration of the UPS rack 10, the contact areas 48 may be changed to accommodate the desired configuration. Other contact area orientations may be provided.

Figure 9:
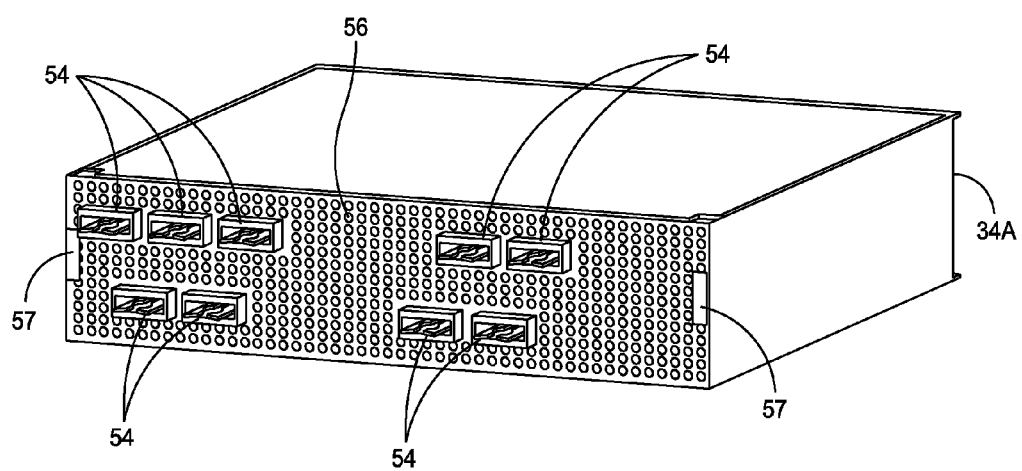
FIG. 9 is a back perspective view of an exemplary power module.

Each module 34, such as the power module 34A illustrated in FIG. 9, includes several connectors, each indicated at 54. As shown, the connectors 54 are provided on a back 56 of the power module 34A. In the shown embodiment, there are nine such connectors 54 provided on the back 56 of the power module 34A. These connectors 54 are spaced from one another so that they align with busbars 44 of the busbar backplane 40 and are positioned to engage contact areas 48 provided on the busbars. In operation, when installed, the connectors 54 are configured to engage and be secured to the busbars 44 to provide an electrical coupling of the power module 34A and the busbars. In one embodiment, every second contact area 48 position must be displaced vertically by 1U to keep a safe distance between the connectors 54. Redundant signal connectors 57 provided along the sides of the power module 34A interface with the redundant connector 42.

Figure 10:
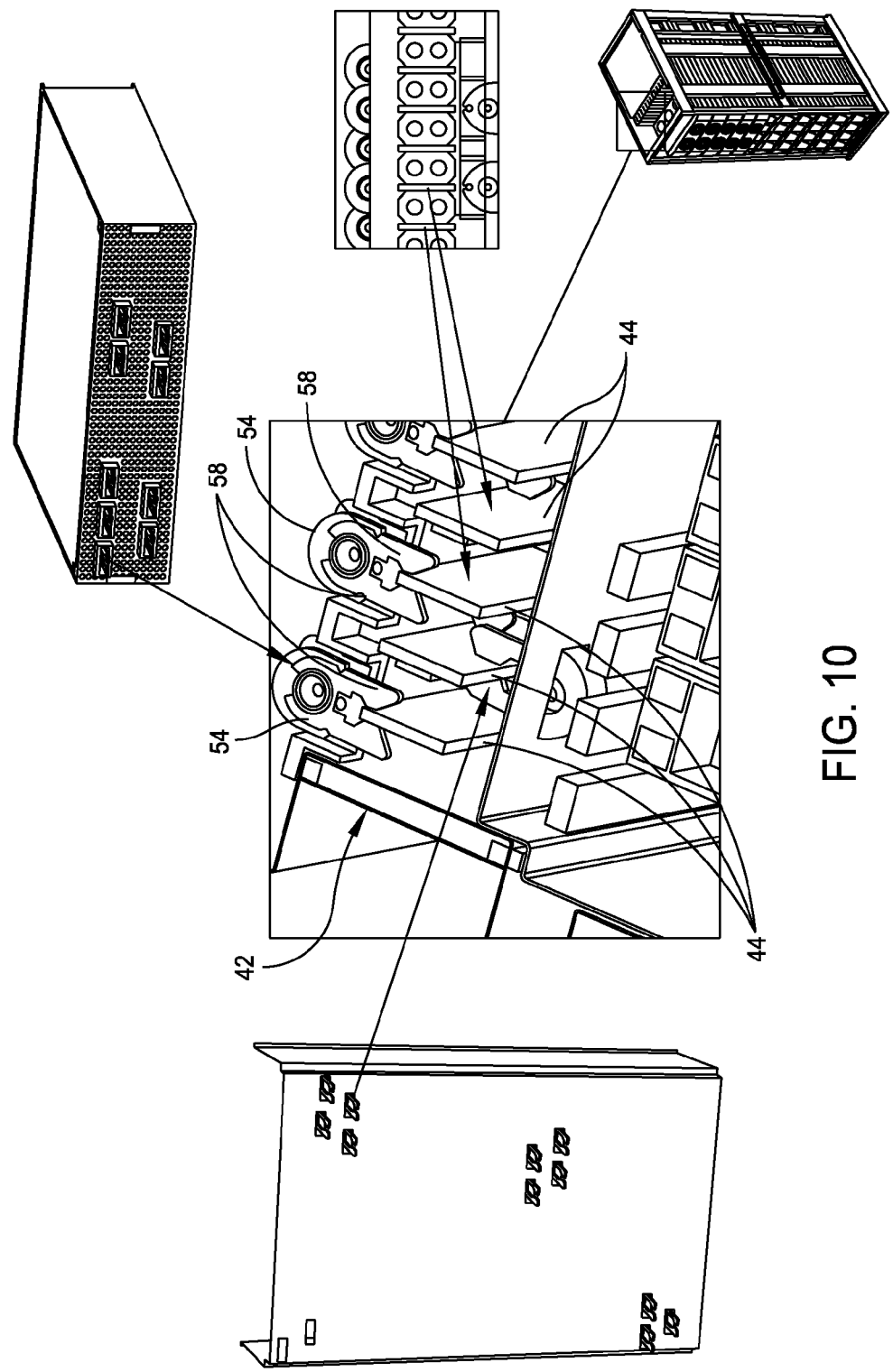
FIG. 10 is a view showing the interface of the busbar backplane and several connectors of a module connected to busbars of the busbar backplane.

Turning to FIG. 10, in one embodiment, the connector 54 includes a pair of spring-loaded arms, each indicated at 58, configured to resiliently engage the busbar 44. As shown, the arms 58 extend from the back 56 of the module. The arms 58 have rounded ends so that when engaging the busbar 44, the arms spread apart as the power module 34A is moved closer and initially engage the busbar. The spring-loaded arms 58 are aligned with respective busbars 44 to provide the necessary connection of the power module 34A to the contact area 48 of the busbar.

The frame assembly 12 may also be configured with at least one redundant connector 42, which is positioned along a side 28 or 30 of the frame assembly. Referring back to FIG. 3, the UPS rack 10 may be provided with two redundant connectors 42 provided at each side of the UPS rack. The redundant connector 42 interface provides a signal interface on the front 16 and the rear 20 sides of the UPS rack 10 for front and rear mounted modules 34 with signal connectors 57.

Figure 11:
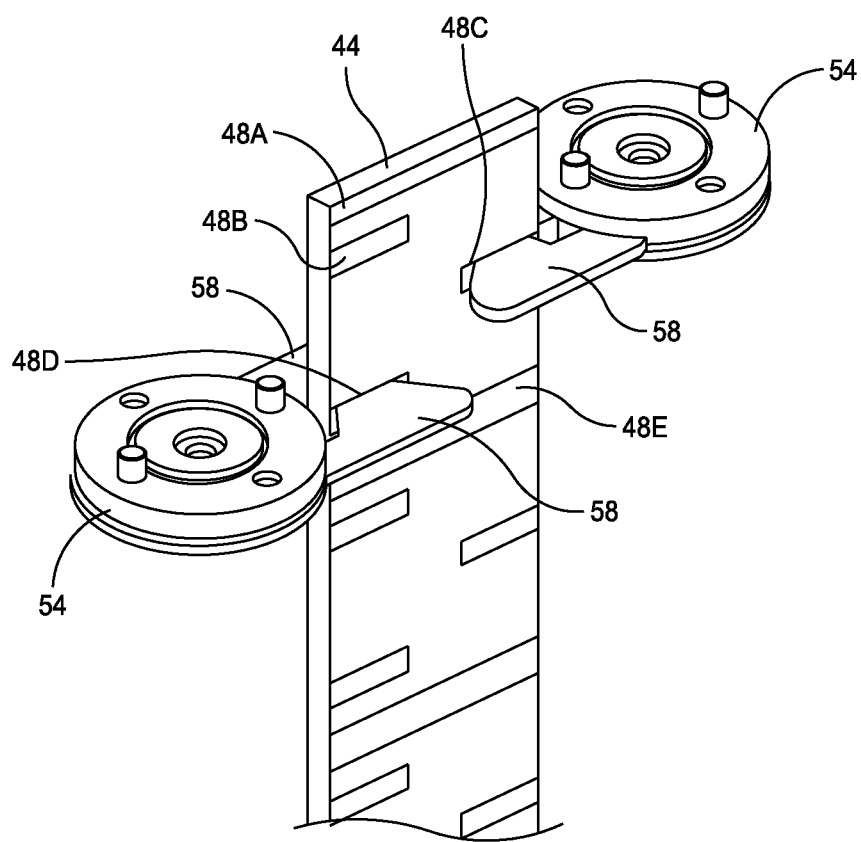
FIG. 11 is a perspective view showing the interface of the busbar and two connectors.

FIG. 11 illustrates the spring-loaded arms 58 of the connector 54 engaging the busbar 44 at contact areas 48 provided on the busbar. Specifically, a connector 54 of a module (not shown) positioned at the rear of the UPS rack (not shown) is engaging a rear contact area 48C of the busbar. Another connector 54, from a module (also not shown) positioned at the front of the UPS rack, is engaging a second front contact area 48D of the busbar 44.

The configuration of the busbars 44 provided in the busbar backplane 40 reduces the amount of signals and is streamlining the way signals are distributed throughout the system. The busbar backplane 40 is configured to connect to modules 34, with a 1U pitch interconnection system that detects size and position of the connected module. The capacity and remaining space can be calculated from the module information, and all the module signals are transferred through this signal connector. One row of printed circuit boards ("PCBs") covers all communication between modules. The PCBs are coupled in series to cover all positions of signal interfaces, both left and right for redundancy and front and rear for connection between the front and rear modules.

Figure 12:
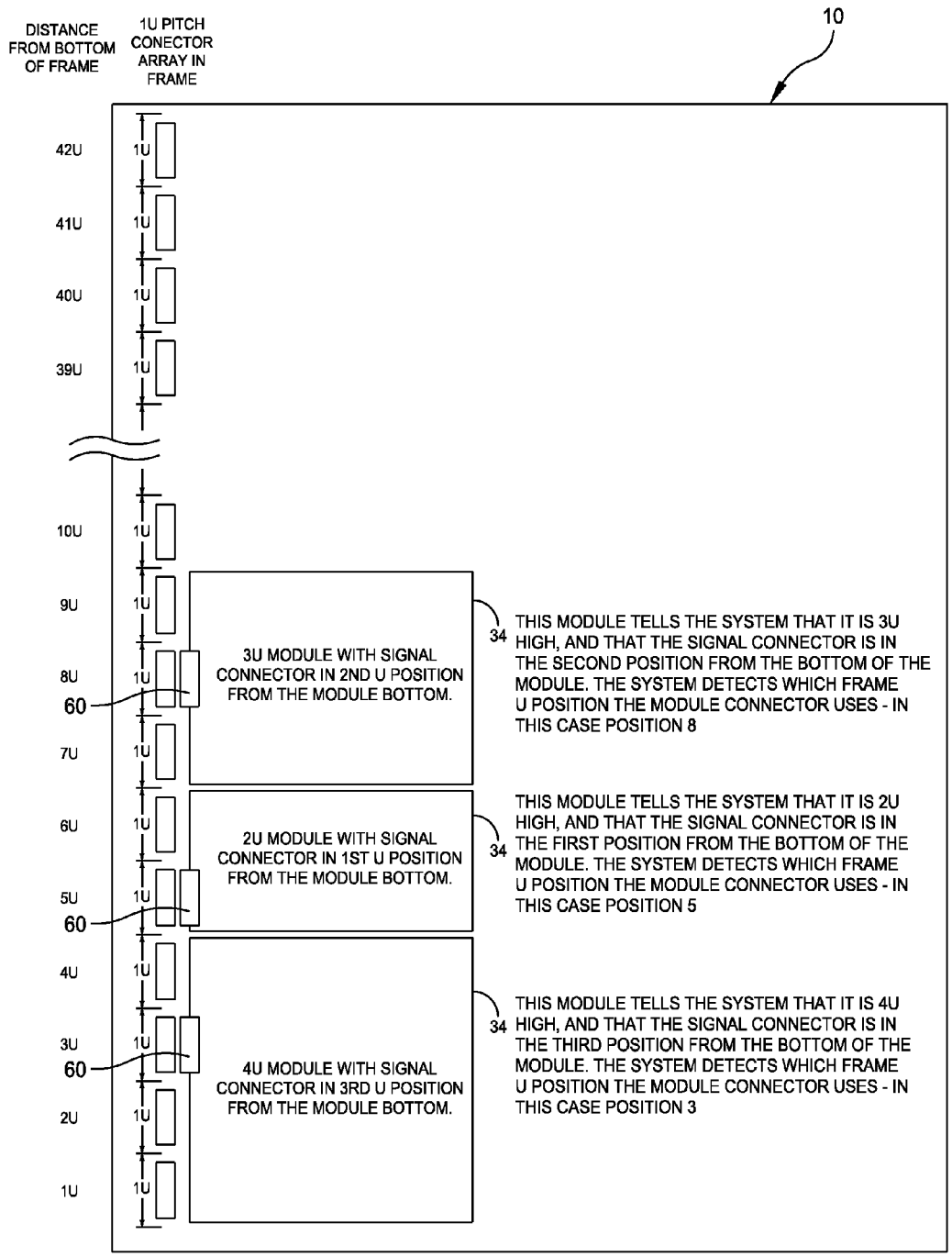
FIG. 12 is a schematic side view showing modules of varying heights disposed within the rack.

Referring to FIG. 12, as mentioned above, the UPS rack 10 may be configured in a variety of ways to accommodate any number of modules 34. For example, for a 42U UPS rack 10, the UPS rack may include one or more controllers (not shown) to control the operation of the UPS rack. As shown, for a 4U module 34 positioned at the bottom of the UPS rack 10, the 4U module may be provided with a signal connector 60 in a $3^{rd}$-U position from a bottom of the module. This module 34 would inform the UPS rack 10 that the 4U module being connected to the UPS rack is a 4U high module, and that the signal connector 60 is in the third position from the bottom of the 4U module. The system detects which frame U-position the 4U module connector uses. In the shown example, the position is three. For the top module 34, which is a 3U module, the 3U module may be provided with a signal connector 60 in a $2^{nd}$-U position from a bottom of the module. This module 34 would inform the UPS rack 10 that the module being connected to the UPS rack is a 3U height module, and that the signal connector 60 is in the second position from the bottom of the module. The system detects which frame U position the module connector uses. In the shown example, the case position is eight. Similarly, for the middle module 34, which is a 2U module, the 2U module may be provided with a signal connector 60 in a $1^{st}$-U position from a bottom of the module. The module 34 would inform the UPS rack 10 that the module being connected to the UPS rack is a 2U height module, and that the signal connector 60 is in the first position from the bottom of the module.

Thus, the UPS rack 10 of the present disclosure is capable of detecting the size and type of module 34 being inserted into the UPS rack. This enables the UPS rack 10 to optimize the placement of modules 34 within the UPS rack based on the demands placed on the UPS rack.

Figure 13:
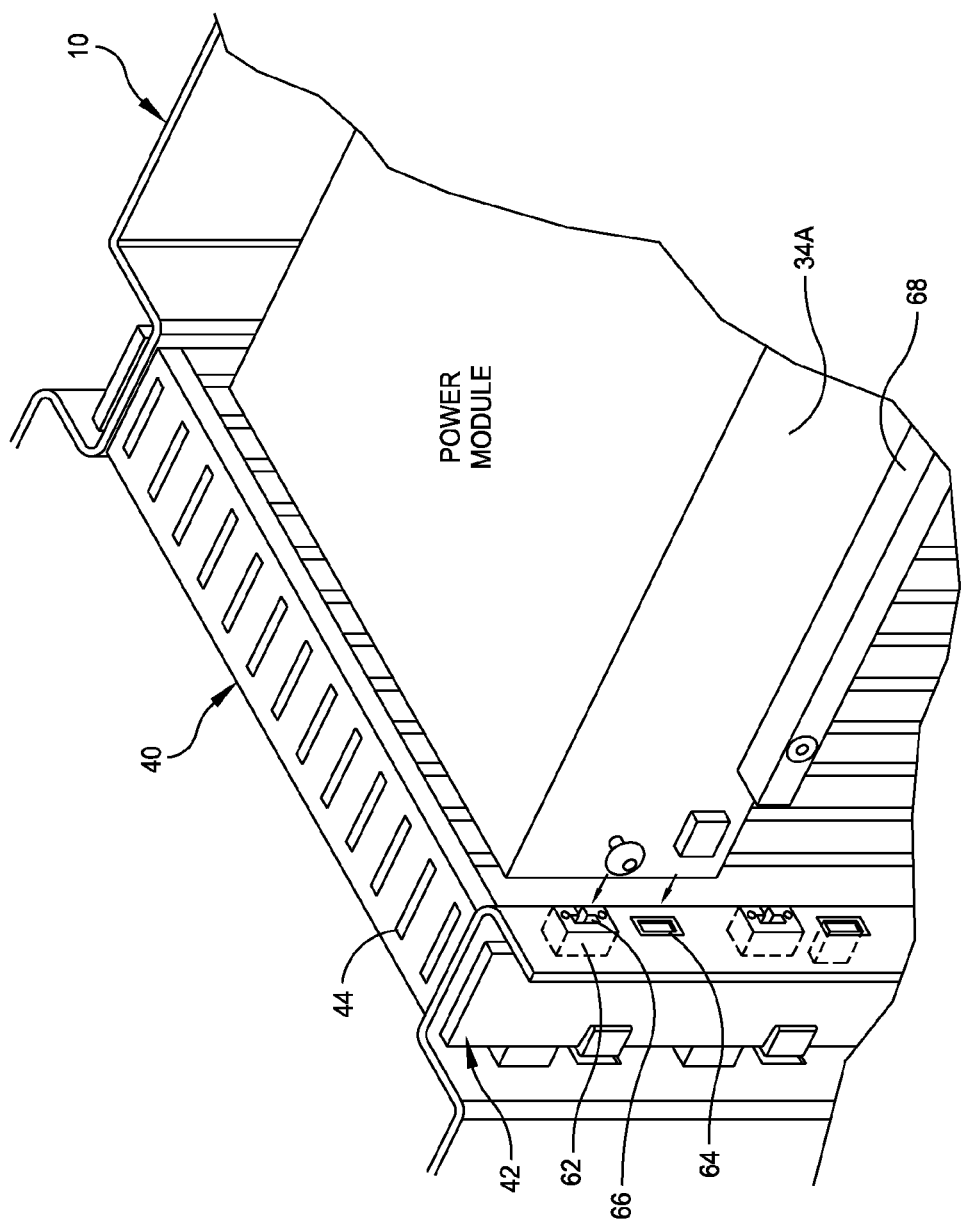
FIG. 13 is a perspective view showing the installation of an exemplary module in the UPS rack.

FIG. 13 illustrates an exemplary module 34, such as a power module 34A, being configured for installation within the UPS rack 10. In the shown embodiment, the UPS rack 10 is provided without shelves, and the UPS rack and the modules are configured with slides to enable the insertion and removal of the modules within the UPS rack. As shown, the power module 34A may be further configured to include a lock block 62 and a signal interface 64 to connect the power module to the UPS rack when installing the power module in the UPS rack. As shown, the lock block 62 includes a track 66. The result is that the modules 34 can slide on integral rails 68 provided on the power module 34A. These integral rails 68 are provided in 1U spacing from the bottom of the interior of the UPS rack 10 to the top of the UPS rack. The provision of the integral rails 68 provides flexibility for the build up and configuration of the UPS rack 10, and, as a result, opens a variety of module configuration options. This mounting system can receive any type of module at any U position within the UPS rack. If the system is built from, for example 3U and 4U modules, the modules can be placed in random order from the bottom up. Heavier modules, such as batteries, should preferably be placed in the bottom, and lighter modules in the top, but any combination within the UPS rack may be possible. The rear modules, while offering less flexibility, may be similarly configured.

Thus, with UPS rack, a method of providing uninterruptible power to sensitive and/or critical loads is disclosed. In one embodiment, the method comprises: providing selected components of an uninterruptible power supply comprising a frame assembly configured to receive electronic modules in stacked relation; inserting at least one electronic module into the frame assembly; electrically coupling the at least one electronic module to a busbar backplane disposed within the frame assembly. It should be noted that the frame assembly may include some or no components of a traditional uninterruptible power supply. For example, only batteries may be provided within the frame assembly.

Thus, it should be observed that the UPS rack of embodiments of the present disclosure reduce the initial system cost, is scalable to the desired configuration, reduces system complexity and reduces overall system development and operation cost. The UPS rack can be configured to operate under a desired voltage range. Higher power density for all power ranges may be achieved due to the flexibility and scalability of the UPS rack. A cable-less frame assembly enables all communication between the components of the UPS rack through the busbar backplane and the redundant connectors. The power modules and batteries are hot swappable both from the front and the back of the of the UPS rack. Smaller systems and larger systems can run on the same firmware since the scaling on the system is based on the installed components.

Frame assemblies for smaller and larger UPS racks are identically configured, with the firmware being scalable depending on the application. If a new module needs to be installed, the firmware to run the module need only be installed.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A configurable rack for supporting components of an uninterruptible power supply, the configurable rack comprising:
    a frame assembly having a front and a rear, wherein the front of the frame assembly and the rear of the frame assembly are configured to receive electronic modules in stacked relation along a height of the frame assembly;
    a busbar backplane disposed between the front and the rear of the frame assembly, the busbar backplane extending vertically within the frame assembly along an entire height of the frame assembly, the busbar backplane extending along a plane parallel to planes defined by the front and the rear of the frame assembly, the busbar backplane including a plurality of busbars; and
    at least one connector coupled to each electronic module, the at least one connector being configured to engage and be secured to the busbar to provide an electrical coupling of the electronic module and the busbar,
    wherein the plurality of busbars and the connectors are configured to electrically couple the electronic modules that are received within the front of the frame assembly and within the rear of the frame assembly in a hot swappable manner, and
    wherein each busbar has a front edge surface, a back edge surface, and two side surfaces, the front edge surface and the back edge surface each having a width that is less than a width of each side surface, each busbar extending in a plane perpendicular to the plane of the busbar backplane so that the front edge surface faces the front of the frame assembly and the rear edge surface faces the rear of the frame assembly, and
    wherein each busbar has a plurality of front contact areas and a plurality of rear contact areas provided along a length of the busbar on opposing flat side surfaces of the busbar, the plurality of front contact areas and rear contact areas being configured to receive the at least one connector associated with the electronic module from the front of the frame assembly and from the rear of the frame assembly.

2. The configurable rack of claim 1, wherein the front is configured to receive electronic modules in stacked relation along a height of the front.

3. The configurable rack of claim 2, wherein the rear is configured to receive electronic modules in stacked relation along a height of the rear.

4. The configurable rack of claim 1, wherein the at least one connector includes a pair of spring-loaded arms configured to resiliently engage the busbar.

5. The configurable rack of claim 1, further comprising at least one redundant connector.

6. The configurable rack of claim 5, wherein the at least one redundant connector is positioned along a side of the frame assembly.

7. The configurable rack of claim 1, wherein the at least one of the front and the rear is configured so that electronic modules are positioned vertically within the frame assembly at predetermined intervals.

8. The configurable rack of claim 1, wherein the electronic modules include a power module.

9. The configurable rack of claim 1, wherein the electronic modules include a battery.

10. A method of providing uninterruptible power to sensitive and/or critical loads, the method comprising:
    providing selected components of an uninterruptible power supply comprising a frame assembly configured to receive electronic modules in stacked relation;
    inserting the electronic modules into the frame assembly, each electronic module having a connector coupled thereto, the connector being configured to engage and be secured to a busbar to provide an electrical coupling of the electronic module and the busbar; and
    electrically coupling the electronic modules to a busbar backplane disposed within the frame assembly, the busbar backplane extending vertically within the frame assembly along an entire height of the frame assembly between a front and a rear of the frame assembly, the busbar backplane including a plurality of busbars, the busbar backplane extending along a plane parallel to planes defined by the front and the rear of the frame assembly,
    wherein the plurality of busbars and the connectors are configured to provide power to the electronic modules received within the front of the frame assembly and the rear of the frame assembly in a hot swappable manner, and
    wherein each busbar has a front edge, a back edge, and two sides extending between front edge and the back edge, the front edge and the back edge being smaller in width than the sides, each busbar extending in a plane perpendicular to the plane of the busbar backplane so that the front edge faces the front of the frame assembly and the rear edge faces the rear of the frame assembly, and
    wherein each busbar has a plurality of front contact areas and a plurality of rear contact areas provided along a length of the busbar on opposing flat side surfaces of the busbar, the plurality of front contact areas and rear contact areas being configured to receive the connectors of the electronic modules from the front of the frame assembly and from the rear of the frame assembly.

11. The method of claim 10, wherein the connector includes a pair of spring-loaded arms configured to resiliently engage the busbar.

12. The method of claim 10, further comprising electrically coupling at least one of the electronic modules to at least one redundant connector.

13. The method of claim 12, wherein the at least one redundant connector is positioned along a side of the frame assembly.

14. The method of claim 10, further comprising inserting the electronic modules into the frame assembly so that the electronic modules are positioned vertically within the frame assembly at predetermined intervals.

15. The method of claim 10, wherein the electronic modules include a power module.

16. The method of claim 10, wherein the electronic modules include a battery.

* * * * *